(12) United States Patent
Jones et al.

(10) Patent No.: US 7,691,708 B2
(45) Date of Patent: Apr. 6, 2010

(54) TRENCH TYPE MOSGATED DEVICE WITH STRAINED LAYER ON TRENCH SIDEWALL

(75) Inventors: David Paul Jones, South Glamorgan (GB); Robert P. Haase, Newport (GB)

(73) Assignee: International Rectifier Corporation, El Segundo, CA (US)

( * ) Notice: Subject to any disclaimer, the term of this patent is extended or adjusted under 35 U.S.C. 154(b) by 10 days.

(21) Appl. No.: 11/804,184

(22) Filed: May 17, 2007

(65) Prior Publication Data

US 2007/0218615 A1    Sep. 20, 2007

Related U.S. Application Data

(62) Division of application No. 10/911,170, filed on Aug. 4, 2004, now Pat. No. 7,238,985.

(60) Provisional application No. 60/494,933, filed on Aug. 13, 2003.

(51) Int. Cl.
*H01L 21/336* (2006.01)

(52) U.S. Cl. .................. 438/259; 257/E29.321

(58) Field of Classification Search .......... 438/259, 438/270, 271, 589
See application file for complete search history.

(56) References Cited

U.S. PATENT DOCUMENTS

| | | | |
|---|---|---|---|
| 6,331,467 | B1 | 12/2001 | Brown et al. |
| 6,472,685 | B2 | 10/2002 | Takagi et al. |
| 7,115,480 | B2 | 10/2006 | Forbes |
| 2003/0102490 | A1 | 6/2003 | Kubo et al. |
| 2004/0009636 | A1 * | 1/2004 | Ichinose et al. ............. 438/199 |
| 2004/0173798 | A1 | 9/2004 | Forbes |
| 2005/0032321 | A1 | 2/2005 | Huang et al. |
| 2005/0287752 | A1 | 12/2005 | Nouri et al. |
| 2006/0051922 | A1 | 3/2006 | Huang et al. |
| 2006/0118880 | A1 | 6/2006 | Komoda |
| 2006/0124935 | A1 | 6/2006 | Bhattacharyya |
| 2006/0138398 | A1 | 6/2006 | Shimamune et al. |
| 2006/0141687 | A1 | 6/2006 | Bhattacharyya |
| 2006/0214222 | A1 | 9/2006 | Challa et al. |
| 2006/0220153 | A1 | 10/2006 | Murthy et al. |
| 2006/0240611 | A1 | 10/2006 | Chan et al. |
| 2006/0246680 | A1 | 11/2006 | Bhattacharyya |

FOREIGN PATENT DOCUMENTS

| | | |
|---|---|---|
| EP | 0 449 620 A2 | 10/1991 |
| JP | 9-92826 | 4/1997 |

OTHER PUBLICATIONS

German Office Action dated Jan. 7, 2008 in the corresponding German Application Serial No. 10 2004 039 981.6-33 with an English translation.
Japanese Office Action dated Mar. 4, 2008 in the corresponding Japanese Application Serial No. 2004-235566 with an English translation.

* cited by examiner

*Primary Examiner*—Kimberly D Nguyen
*Assistant Examiner*—Tony Tran
(74) *Attorney, Agent, or Firm*—Farjami & Farjami LLP

(57) ABSTRACT

A MOSgated trench device has a reduced on resistance by forming a less than about a 13 nm thick strained SiGe layer on the silicon surface of the trenches and forming a thin (30 nm or less) layer of epitaxially deposited silicon on the SiGe layer which epi layer is converted to a gate oxide layer. The conduction channel formed by the SiGe layer is permanently strained to increase its mobility particularly hole mobility.

9 Claims, 2 Drawing Sheets

TRENCH TYPE MOSGATED DEVICE WITH STRAINED LAYER ON TRENCH SIDEWALL

RELATED APPLICATION

Figure 1:
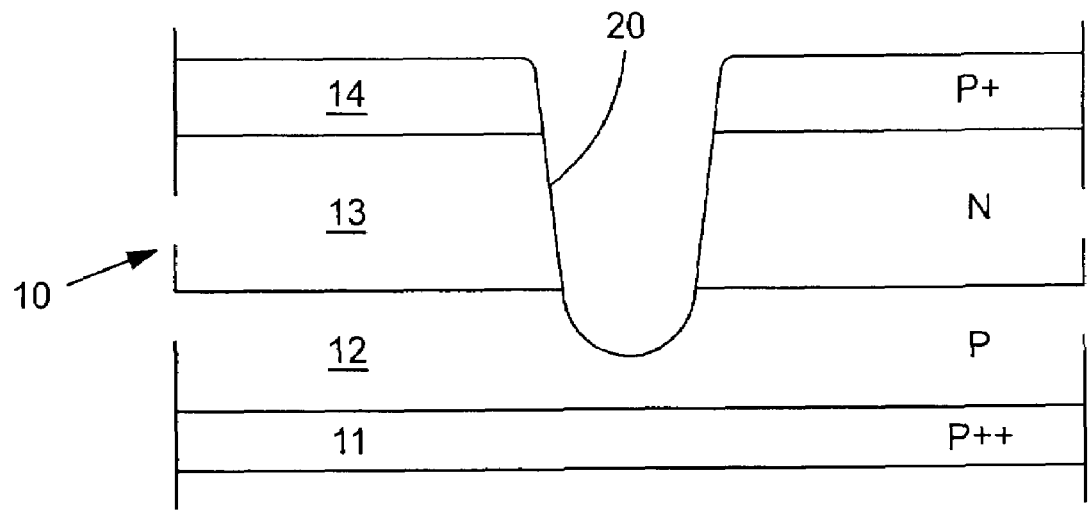

This application is a division of U.S. patent application Ser. No. 10/911,170, filed Aug. 8, 2004, entitled Trench Type MOSgated Device With Strained Layer on Trench Sidewall which claims the benefit of U.S. Provisional Application No. 60/494,933, filed Aug. 13, 2004 and the disclosure of which is incorporated herein by reference.

FIELD OF THE INVENTION

This invention relates to MOSgated devices and more specifically relates to a trench type MOSgated devices in which trenches in a silicon substrate have strained silicon germanium epitaxially deposited layer on the trench side wall surfaces to increase carrier mobility.

BACKGROUND OF THE INVENTION

Trench type MOSgated devices such as power MOSFETs and IGBTs are well known, wherein an insulation gate lines the side walls in spaced trenches, covering an invertible channel region along at least portions of the walls of the trench. A conductive polysilicon gate then fills the trenches.

The on resistance and the gate charge of the device is determined, in part, by the carrier mobility in this channel region.

It would be desirable to increase the mobility of the channel region in a trench device or, indeed, in a lateral surface channel of a planar device, to reduce on resistance and improve high speed switching performance.

BRIEF DESCRIPTION OF THE INVENTION

In accordance with the invention, a strained SiGe layer is formed on the channel region, (the trench side walls in a trench device) and this is then covered with a thin epitaxially deposited silicon layer. A gate oxide layer is formed on the Silicon epi layer. A conductive gate is then added. Thus, in a trench device, the trench is filled with a conductive gate, preferably doped polysilicon. The SiGe layer is strained because of its interface to the underlying silicon and this increases carrier mobility in the channel region formed in the SiGe layer.

Thus, the novel device of the invention is manufactured, using all conventional steps, but, in the case of a trench device, and after the trench is etched, a permanently strained SiGe layer is deposited to increase carrier mobility. The preferred method to induce the strain is as follows:

1. grow a thin SiGe layer on the channel surface, as in the trench of a trench device;
2. grow a thin silicon epitaxial layer on the SiGe layer to about one-half the thickness of the intended gate oxide; and
3. grow a gate oxide on the silicon epitaxial layer. If desired, the oxide can be formed by, consuming at least a portion of the silicon epitaxial layer thus thinning or consuming the entire epi layer.

The degree of compressive strain in the SiGe layer is controlled by the ratio of Si and Ge in the layer. A suitable stoichiometry is selected to give the desired strain without causing dislocations in the crystal lattice. This ratio should be in the range $Si_{0.85}Ge_{0.15}$ to $Si_{0.7}Ge_{0.3}$ and may be $Si_{0.8}Ge_{0.2}$. The final thickness of the SiGe layer is chosen to be less than the thickness above which the strained lattice structure starts to relax. This may be about 10 nm (nanometers) and preferably less than about 13 nm. The SiGe layer deposited on silicon will adapt to the silicon lattice spacing of the trench wall. Therefore, the silicon adjacent to the SiGe layer will be permanently strained and thus will have greater carrier mobility, and in particular hole mobility, for example 20 to 45% greater than monocrystalline silicon.

A thin silicon layer is subsequently grown epitaxially atop the SiGe layer. This layer will be used to grow a high quality gate oxide and will normally be consumed or at least partially consumed in the process of thermal oxidation.

DETAILED DESCRIPTION OF THE FIGURES

Figure 2:
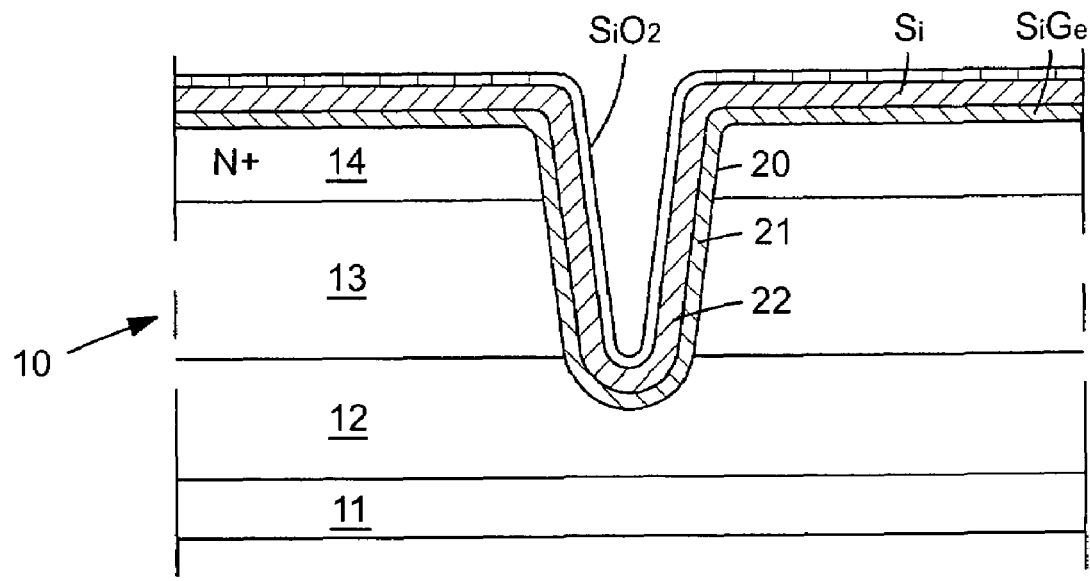
Figure 3:
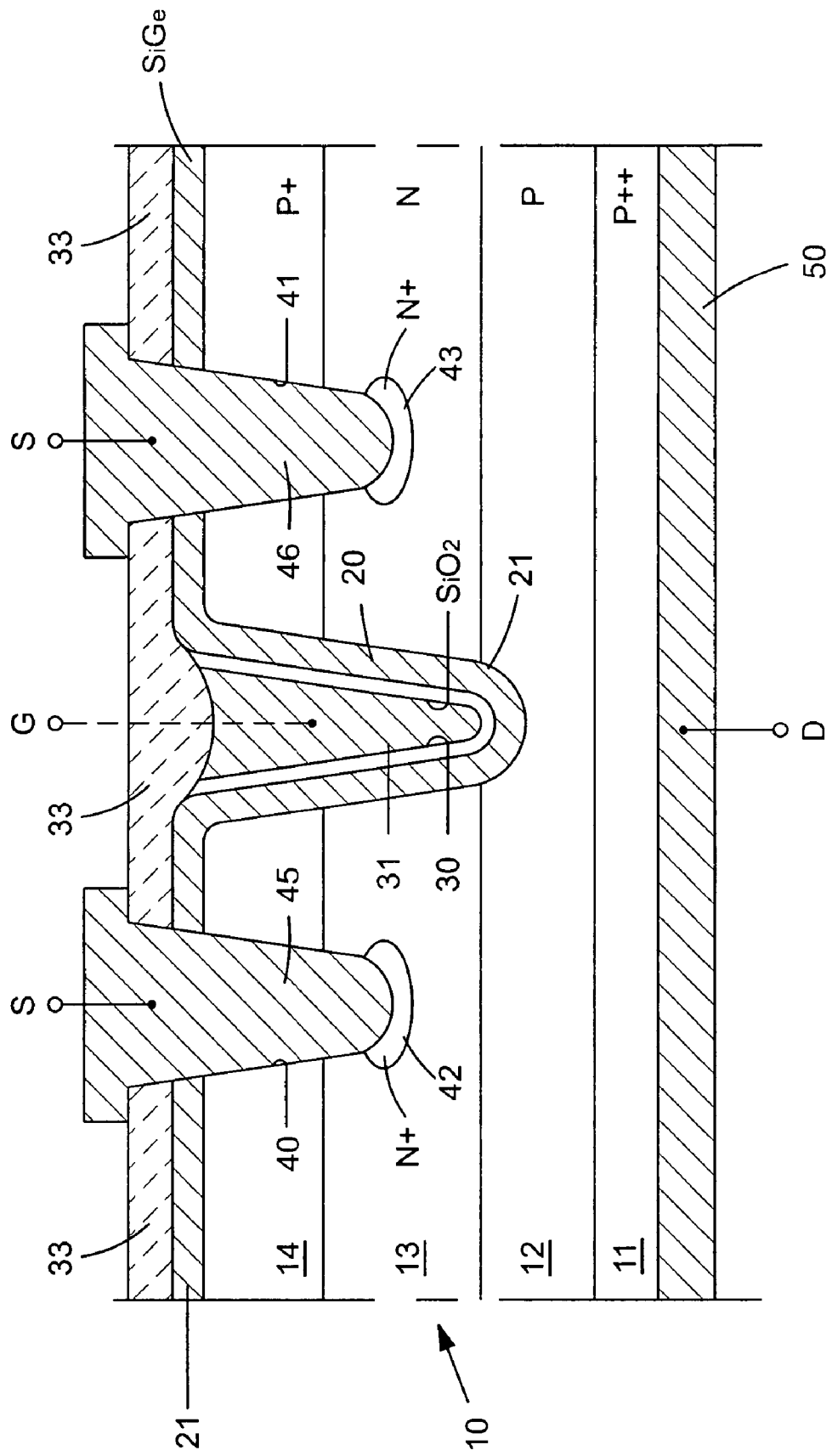

FIGS. 1, 2 and 3 show the process of manufacture and final device for a single cell (in cross-section), of a plurality of spaced identical cells, made in accordance with the invention. The topology of the cell may be stripe or closed cell or any other desired topology. The final device may have any desired reverse voltage capability, and could, for example, be for a low voltage (20 volt) MOSFET or any other MOSgated device. The invention is also applicable to planar devices.

In a preferred embodiment, a starting wafer 10 is provided in FIG. 1 which may be a $P^{++}$ wafer having a body 11 of any desired thickness with an P type epitaxially deposited layer 12 thereon which may have a thickness of about 5 microns and a suitable resistivity for a 20 volt (or any other desired voltage) device. The conductivity types can be reversed.

An N type blanket channel implant 13 is formed into the top surface of epi region 12, and is suitably diffused to the desired depth. A boron or BF2 implant is then formed into the top of N region 13 and is diffused to form $P^+$ source layer 14.

Plural spaced trenches, one of which is shown in FIG. 1 as trench 20, are then etched into the top of the wafer 10, reaching into region 12. Trench 20 may have a depth of about 2 microns and a width of about 0.6 microns. The trenches may have any desired center-to-center spacing or pitch.

Thereafter, and as shown in FIG. 2, the wafer has an SiGe layer 21 grown thereon to a thickness of about 10 nm. Layer 21 is grown with a germanium content of about 20%. The SiGe layer 21 deposited on the silicon surface will adopt the Si lattice spacing of the trench wall. Therefore, the deposition of SiGe will be permanently strained. It is important to keep the SiGe layer thin and preferably below 13 nm in order to generate a permanently strained lattice which will form a transistor channel with increased mobility, particularly, hole mobility.

A thin layer 22 of silicon, for example, about 10 nm thick is next grown atop layer 21. The thickness of this silicon layer is chosen such that during subsequent thermal oxidation steps it will preferably be wholly consumed to form gate oxide.

The device may then completed, using conventional process steps as shown in FIG. 3. Thus, a gate oxide 30, or other gate dielectric is present to a thickness of about 20 nm over the surface of the device. It may be desirable to grow a sacrificial oxide $SiO_2$ which is subsequently removed before the gate oxidation step to improve the final gate quality. If this is the case the silicon layer 22 will need to be made correspondingly thicker to accommodate for the extra consumption during oxidation.

A conductive polysilicon layer or plug 31 is next formed atop the gate oxide 30 (FIG. 3). The polysilicon 31 is conventionally doped to make it conductive. The wafer 10 is then patterned and the gate oxide 30, and polysilicon 31 layers are etched back, leaving the oxide gate 30 and polysilicon gate 31 in the trench 20, adjacent the surface of strained SiGe layer 21.

A further dielectric capping layer 33, such as TEOS is next deposited atop the wafer. Windows are then opened in layer 33 and source contact trenches 40 and 41 are formed into the top surface of the wafer. N$^+$ contact diffusions 42 and 43 are formed at the bottom of trenches 40 and 41. A source metal contact 45, 46 is then deposited atop the wafer and into the trenches 40 and 41 respectively. A drain electrode 50 is also conventionally formed.

Note that all gate polysilicon plugs 31 are connected together and are connected to a gate terminal G, and that source metals 45 and 46 are connected together and to a source terminal. A further connection to the drain terminal D is made on the backside of the wafer electrode 50.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. The process of forming a trench type MOSgated device having a reduced on-resistance, comprising: forming a trench in a monocrystalline silicon wafer; forming a strained SiGe layer over the surface of sidewalls of said trench after said forming said trench; forming a thin layer of epitaxially formed silicon over the surface of said SiGe layer; converting at least a portion of said epitaxially formed silicon to an oxide to form a gate dielectric layer over said SiGe layer; and forming a conductive gate over the surface of said gate dielectric layer.

2. The process of claim 1, wherein said SiGe layer has a thickness of about 10 nm.

3. The process of claim 1, wherein the percentage of Ge in said SiGe layer is constant during the deposition of said layer.

4. The process of claim 1, wherein said Ge is about 20% of the SiGe layer.

5. The process of claim 4, wherein the percentage of Ge in said SiGe layer is constant during the deposition of said layer.

6. The process of claim 2, wherein said Ge is about 20% of the SiGe layer.

7. The process of claim 2, wherein said thin layer of epitaxially formed silicon has a thickness less than 30 nm.

8. The process of claim 3, wherein said thin layer of epitaxially formed silicon has a thickness less than 30 nm.

9. The process of claim 4, wherein said thin layer of epitaxially formed silicon has a thickness less than 30 nm.

* * * * *